(12) United States Patent
Choi

(10) Patent No.: US 10,324,119 B2
(45) Date of Patent: Jun. 18, 2019

(54) INSULATION RESISTANCE MEASURING DEVICE AND METHOD

(71) Applicant: LG CHEM, LTD., Seoul (KR)

(72) Inventor: Ho-Been Choi, Daejeon (KR)

(73) Assignee: LG CHEM, LTD., Seoul (KR)

(*) Notice: Subject to any disclaimer, the term of this patent is extended or adjusted under 35 U.S.C. 154(b) by 188 days.

(21) Appl. No.: 15/531,141

(22) PCT Filed: Mar. 10, 2016

(86) PCT No.: PCT/KR2016/002414
§ 371 (c)(1),
(2) Date: May 26, 2017

(87) PCT Pub. No.: WO2016/144120
PCT Pub. Date: Sep. 15, 2016

(65) Prior Publication Data
US 2017/0328940 A1 Nov. 16, 2017

(30) Foreign Application Priority Data

Mar. 10, 2015 (KR) .................. 10-2015-0033222
Mar. 9, 2016 (KR) .................. 10-2016-0028304

(51) Int. Cl.
*G01R 27/08* (2006.01)
*G01R 31/36* (2019.01)
(Continued)

(52) U.S. Cl.
CPC ............. *G01R 27/08* (2013.01); *G01R 19/15* (2013.01); *G01R 27/025* (2013.01); *G01R 27/18* (2013.01);
(Continued)

(58) Field of Classification Search
CPC ...... G01R 27/08; G01R 27/025; G01R 27/18; G01R 31/36; G01R 31/12; G01R 19/15;
(Continued)

(56) References Cited

U.S. PATENT DOCUMENTS 7,952,327 B2   5/2011   Kudo et al.
9,024,646 B2   5/2015   Huh
(Continued)

FOREIGN PATENT DOCUMENTS

JP    2006-226827 A    6/2006
JP    2006-250831 A    9/2006
(Continued)

OTHER PUBLICATIONS

International Search Report, issued in PCT/KR2016/002414 (PCT/ISA/210), dated Jul. 8, 2016.

*Primary Examiner* — Jeff W Natalini
(74) *Attorney, Agent, or Firm* — Birch, Stewart, Kolasch & Birch, LLP

(57) ABSTRACT

The present disclosure relates to an insulation resistance measuring device and method, including a parameter resistance connected to a negative electrode terminal of a battery; a shunt resistance connectable to the parameter resistance; a current detection circuit including an operational amplifier configured to detect and output voltage between both ends of the shunt resistance; and a control unit configured to determine the insulation resistance of the battery using a switch control terminal configured to control a switch connected between the parameter resistance and the shunt resistance to an ON or OFF state, a detection signal output terminal configured to selectively apply a first high voltage signal and a first low voltage signal to the shunt resistance, a control signal output terminal configured to apply a control voltage signal to the operational amplifier to adjust an output voltage of the operational amplifier within a predetermined range, an (Continued)

ADC connected to an output terminal of the operational amplifier, and a predefined insulation resistance formula that includes, as a parameter, a first voltage change amount with respect to the output voltage of the operational amplifier being measured through the ADC when the first high voltage signal and the first low voltage signal are applied to the shunt resistance.

20 Claims, 8 Drawing Sheets

(51) Int. Cl.
| | | |
|---|---|---|
| *G01R 19/15* | (2006.01) | |
| *G01R 31/12* | (2006.01) | |
| *G01R 27/02* | (2006.01) | |
| *G01R 27/18* | (2006.01) | |
| G01R 15/09 | (2006.01) | |
| G01R 31/00 | (2006.01) | |
| G01R 31/02 | (2006.01) | |
| G01R 31/385 | (2019.01) | |

(52) U.S. Cl.
CPC ............. *G01R 31/12* (2013.01); *G01R 31/36* (2013.01); *G01R 15/09* (2013.01); *G01R 31/006* (2013.01); *G01R 31/025* (2013.01); *G01R 31/385* (2019.01)

(58) Field of Classification Search
CPC .. G01R 31/392; G01R 31/385; G01R 31/025; G01R 31/006; G01R 15/09
USPC .................................................. 324/425–437
See application file for complete search history.

(56) References Cited

U.S. PATENT DOCUMENTS

| | | | |
|---|---|---|---|
| 9,069,024 B2* | 6/2015 | Yang .................... | G01R 27/025 |
| 9,581,652 B2 | 2/2017 | Klijn | |
| 9,864,013 B2* | 1/2018 | Kawanaka ........... | G01R 27/025 |
| 2007/0241758 A1 | 10/2007 | Kamata | |
| 2008/0238432 A1* | 10/2008 | Botker ................. | G01R 31/396 |
| | | | 324/434 |
| 2009/0295401 A1 | 12/2009 | Kamata | |
| 2012/0016613 A1* | 1/2012 | Yang ..................... | G01R 27/16 |
| | | | 702/65 |
| 2012/0235824 A1 | 9/2012 | Tu et al. | |
| 2013/0176042 A1* | 7/2013 | Huh ...................... | B60L 3/0069 |
| | | | 324/693 |
| 2014/0301000 A1 | 10/2014 | Takahashi et al. | |

FOREIGN PATENT DOCUMENTS

| | | |
|---|---|---|
| JP | 2012-32185 A | 2/2012 |
| JP | 2013-537313 A | 9/2013 |
| JP | 5705870 B2 | 4/2015 |
| KR | 10-2008-0022486 A | 3/2008 |
| KR | 10-2010-0105954 A | 10/2010 |
| KR | 10-2012-0117745 A | 10/2012 |
| KR | 10-2013-0080579 A | 7/2013 |
| KR | 10-2014-0055186 A | 5/2014 |
| KR | 10-1512395 B1 | 4/2015 |

* cited by examiner

INSULATION RESISTANCE MEASURING DEVICE AND METHOD

TECHNICAL FIELD

The present application claims priority to Korean Patent Applications No. 10-2015-0033222 and No. 10-2016-0028304 filed on Mar. 10, 2015, and on Mar. 9, 2016, respectively, in the Republic of Korea, the disclosures of which are incorporated herein by reference.

The present disclosure relates to an insulation resistance measuring device and method, and more particularly, to an insulation resistance measuring device capable of measuring insulation resistance of a battery, and a method thereof.

BACKGROUND ART

As development and demand for techniques regarding mobile equipment, electric vehicles, hybrid vehicles, power storage devices, uninterrupted power devices and the like increase, demand for secondary batteries as energy source is rapidly increasing, and the form of demand is becoming diverse as well. Therefore, a lot of researches regarding batteries consisting of secondary batteries are underway in order to respond to various needs.

Meanwhile, in a device such as an electric vehicle and a hybrid vehicle that uses a high-power high-capacity battery, it is necessary to maintain the state of insulation between the battery and the device well. That is because, unless the state of insulation of the batteries is maintained well, leakage current may occur, causing various problems. For reference, leakage current causes unexpected discharge of battery or malfunction of electronic equipment provided in the device. Further, a device such as an electric vehicle that uses a high-voltage battery may cause fatal electric shock damages to humans.

As such, in an electric vehicle or a hybrid vehicle that uses a high-voltage battery, measuring insulation resistance is very important. As a method for measuring leakage current between a high-voltage battery and a vehicle, there is a method of breaking insulation and forcing DC current to flow, but such a method has a disadvantage that insulation is broken while measuring insulation resistance. Further, another conventional insulation resistance measuring method connects a coupling condenser between a positive electrode terminal and a negative electrode terminal of a high-voltage battery, and a vehicle, and applies an AC signal to the coupling condenser to measure an insulation resistance component. This has a disadvantage that since a current for charging the coupling condenser and a current for discharging the coupling condenser have to pass the same circuit, circuit designing is complicated, and there are much limitations to realizing the circuit.

Thus, in measuring the insulation resistance of a high-voltage battery, it is necessary to develop a compact, light-weight and low-cost insulation resistance measuring circuit capable of measuring the insulation resistance more easily and exactly.

DISCLOSURE

Technical Problem

The present disclosure is designed to solve the problems of the related art, and therefore the present disclosure is directed to providing an insulation resistance measuring device and method configured to be connected to a negative electrode terminal of a high-voltage battery including a secondary battery to measure insulation resistance of the battery.

Further, a purpose of the present disclosure is to provide an insulation resistance measuring device and method for measuring insulation resistance using an operational amplifier (OP-amp) so as not to be affected externally.

Further, another purpose of the present disclosure is to provide an insulation resistance measuring device and method, capable of measuring the insulation resistance without any effect of a high-voltage battery voltage.

Technical Solution

In one aspect of the present disclosure, there is provided a device for measuring insulation resistance of a battery, the device including a parameter resistance of which one end is electrically connected to a negative electrode terminal of the battery; a current detection circuit including a shunt resistance connectable to the parameter resistance to enable at least a portion of leakage current of the battery flowing in the parameter resistance to flow, and an operational amplifier connected to both terminals of the shunt resistance and configured to detect and output voltage between both ends of the shunt resistance; and a control unit configured to determine the insulation resistance of the battery using a switch control terminal configured to control a switch connected between the parameter resistance and the shunt resistance to an ON or OFF state, a detection signal output terminal configured to selectively apply a first high voltage signal and a first low voltage signal to the shunt resistance, a control signal output terminal configured to apply a control voltage signal to the operational amplifier to adjust an output voltage of the operational amplifier within a predetermined range, an ADC connected to an output terminal of the operational amplifier, and a predefined insulation resistance formula that includes, as a parameter, a first voltage change amount with respect to the output voltage of the operational amplifier being measured through the ADC when the first high voltage signal and the first low voltage signal are applied to the shunt resistance.

Preferably, the control signal output terminal may include a first and second signal output terminal configured to selectively output a second high voltage signal and a second low voltage signal, the current detection circuit may include a first and second control resistance connected to the first and second control signal output terminal, respectively, and the first and second control resistance may be connected parallel to each other and one end thereof may be connected to an inverting terminal of the operational amplifier.

Preferably, the current detection circuit may further include a first connecting resistance configured to connect one end of the shunt resistance to a non-inverting terminal of the operational amplifier, and a second connecting resistance configured to connect the other end of the shunt resistance to the inverting terminal of the operational amplifier.

Preferably, the control unit may be configured to apply the first high voltage signal and the first low voltage signal to the shunt resistance at time intervals through the detection signal output terminal in a state where the switch is controlled to an ON state, and to measure a first voltage change amount with respect to the output voltage of the operational amplifier through the ADC, when the first high voltage signal and the first low voltage signal are being applied to the shunt resistance.

Preferably, the control unit may be configured to apply a third high voltage signal and a third low voltage signal to the shunt resistance at time intervals through the detection signal output terminal, in a state where the switch is controlled to the OFF state, to determine a second voltage change amount with respect to the output voltage of the operational amplifier being measured through the ADC when the third high voltage signal and the third low voltage are being applied to the shunt resistance, to determine a third voltage change amount corresponding to a difference between the first voltage change amount and the second voltage change amount, and to determine the insulation resistance of the battery using the predefined insulation resistance formula that includes the third voltage change amount as a parameter.

Preferably, the control unit may be configured to selectively apply the second high voltage signal or the second low voltage signal to the first control resistance and the second control resistance through the first and second control signal output terminal until the output voltage of the operational amplifier being measured through the ADC belongs to a predetermined operating voltage range of the ADC, when the output voltage does not belong to the predetermined operational voltage range.

In the present disclosure, the predefined insulation resistance formula may further include as a parameter control voltage change amount being applied to an equivalent resistance of the first control resistance and the second control resistance according to a level of the voltage signal being output through the first and second control signal output terminal, when a high voltage signal and a low voltage signal are being applied to the shunt resistance through the detection signal output terminal.

The insulation resistance measuring device according to the present disclosure may further include a memory unit configured to store a resistance value of the insulation resistance therein. Further, the control unit may be configured to output a resistance value of the insulation resistance to an external control device.

In another aspect of the present disclosure, there is provided a method for measuring insulation resistance of a battery using a parameter resistance connected to a negative electrode terminal of the battery, a shunt resistance, a switch installed between the parameter resistance and the shunt resistance, an operational amplifier connected to both terminals of the shunt resistance and a control resistance coupled to at least one of input terminals of the operational amplifier so that an output voltage of the operational amplifier may be controlled, the method including: (a) controlling the switch to an ON state; (b) measuring the output voltage of the operational amplifier when a first high voltage signal and a first low voltage signal are applied to the shunt resistance at time intervals; (c) applying a control voltage signal to one end of the control resistance to control the output voltage of the operational amplifier to be included within a predetermined range; (d) determining a first voltage change amount with respect to the output voltage of the operational amplifier; and (e) determining the insulation resistance of the battery using a predefined insulation resistance formula that includes the first voltage change amount as a parameter.

Preferably, the method according to the present disclosure may further include controlling the switch to an OFF state; applying a third high voltage signal and a third low voltage signal to the shunt resistance at time intervals through the detection signal output terminal; measuring the output voltage of the operational amplifier when the third high voltage signal and the third low voltage signal are applied; applying a control voltage signal to one end of the control resistance to control the output voltage of the operational amplifier to be included within a predefined range; determining a second voltage change amount with respect to the output voltage of the operational amplifier; determining a third voltage change amount corresponding to a difference between the first voltage change amount and the second voltage change amount; and determining the insulation resistance of the battery using the predefined insulation resistance formula that includes the third voltage change amount as a parameter.

In the present disclosure, the control resistance may include at least two control resistances connected in parallel to each other, and one end of each control resistance may be connected to an inverting terminal of the operational amplifier. In this case, the present disclosure may further include selectively applying a second high voltage signal or a second low voltage signal to each control resistance so that the output voltage of the operational amplifier is included within a predetermined range.

Preferably, the method of the present disclosure may further include selectively applying the second high voltage signal or the second low voltage signal to each control resistance until the output voltage of the operational amplifier belongs to the predetermined voltage range when the output voltage of the operational amplifier does not belong to the predetermined voltage range.

Preferably, the predefined insulation resistance formula may further include as a parameter a control voltage change amount being applied to the control resistance with reference to when a high voltage signal is applied to the shunt resistance and when a low voltage signal is applied to the shunt resistance.

The method according to the present disclosure may further include storing the resistance value of the insulation resistance in a memory unit or outputting the resistance value of the insulation resistance to an external control device.

Advantageous Effects

According to the present disclosure, it is possible to measure insulation resistance using an operational amplifier (OP-amp), and thus it is possible to measure the exact insulation resistance without being affected externally.

Further, it is possible to measure the insulation resistance by connecting to the negative electrode terminal of the high-voltage battery. Therefore, since there is no need for an expensive circuit component having excellent withstanding voltage properties, it is possible to measure insulation resistance more simply at minimum cost.

Further, since the effect of a voltage of the high-voltage battery is removed, it is possible to measure the exact insulation resistance.

DESCRIPTION OF DRAWINGS

The accompanying drawings illustrate a preferred embodiment of the present disclosure and together with the detailed descriptions below, serve to provide further understanding of the technical spirit of the present disclosure, and thus, the present disclosure is not construed as being limited to the drawing.

BEST MODE

Figure 1:
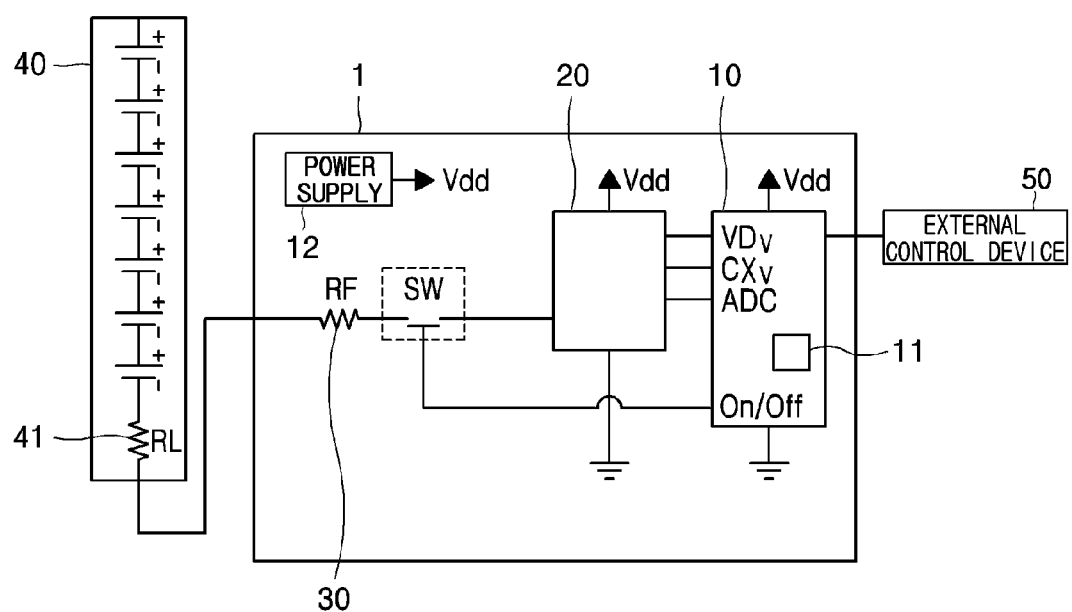
FIG. 1 is a circuit diagram of an insulation resistance measuring device according to an embodiment of the present disclosure.

Regarding the embodiments of the present disclosure disclosed in the main text, specific structural and functional explanations are exemplified merely for the purpose of explaining the embodiments of the present disclosure, and thus the embodiments of the present disclosure may be implemented in various forms and should not be construed as being limited to the embodiments explained in the main text.

Various modifications may be made to the present disclosure, and the present disclosure may have various forms, and thus specific embodiments will be exemplified in the drawings and explained in detail in the main text. However, it should be understood that this is not to limit the present disclosure to a certain form of disclosure, but that the present disclosure includes all modifications, equivalents and alternatives within the concept and technical scope of the present disclosure.

Terms such as a first and a second may be used to explain various elements but these elements should not be limited by those terms. These terms are only used for the purpose of differentiating one element from other elements. For example, without departing from the scope of the present disclosure, a first element may be called a second element, and similarly, the second element may be called a first element as well.

When an element is mentioned to be "connected" or "coupled" to another element, it should be understood that the element may be directly connected or coupled to the other element, but that there may be another component therebetween. On the other hand, when an element is mentioned to be "directly connected" or "directly coupled" to another element, it should be understood that there is no other component therebetween. Other expressions explaining the relation between elements, such as "between~", "directly between~", or "adjacent to~", and "directly adjacent to~" and the like should also be construed as aforementioned.

Terms used in the present disclosure are used merely to explain certain embodiments, not to limit the present disclosure. Singular expressions include plural expressions unless clearly mentioned otherwise in the context. It should be understood that, in the present disclosure, terms such as "include/comprise" or "have/has" and so on are intended to designate existence of a characteristic, a number, a step, an operation, an element, a component or a combination thereof disclosed in the present specification, not to exclude beforehand possibility of existence or addition of one or more other characteristics, numbers, steps, operations, elements, components or combinations thereof.

Unless defined otherwise, all terms used herein including technical or scientific terms have the same meanings as those generally understood by one skilled in the related art. Terms such as those defined in generally used dictionaries should be construed as having the same meanings as those in the context of the related art, and should not be construed as having idealistic or overly formal meanings unless defined explicitly in the present application.

Meanwhile, in the case where an embodiment may be realized differently, a function or operation specified in a certain block may take place differently from the order specified in the flowchart. For example, two consecutive blocks may actually be performed substantially at the same time, and depending on related functions or operations, the blocks may be performed reversely.

Hereinafter, preferable embodiments of the present disclosure will be explained with reference to the accompanying drawings.

FIG. 1 is a circuit diagram of an insulation resistance measuring device 1 according to an embodiment of the present disclosure.

Referring to FIG. 1, the insulation resistance measuring device 1 according to the present disclosure may include a control unit 10, a current detection circuit 20, a parameter resistance 30 and a switch SW.

One end of the parameter resistance 30 may be electrically connected to a negative electrode terminal of a high-voltage battery 40. The parameter resistance 30 may be used as a parameter in the process of determining an insulation resistance 41 according to the present disclosure.

The parameter resistance 30 has a quite large resistance value, for example, a resistance value of several MΩ. If the parameter resistance 30 has a large resistance value, it is possible to electrically protect the insulation resistance measuring device 1 that operates at a lower voltage than the high-voltage battery 40 from the high-voltage battery 40.

The high-voltage battery 40 includes a plurality of secondary batteries connected in series and/or in parallel. The high-voltage battery 40 refers to a high-capacity battery used in electric vehicles or hybrid vehicles, power storage devices and the like.

Preferably, the secondary battery included in the high-voltage battery 40 may be a lithium secondary battery, but there is no limitation thereto. Further, the present disclosure is not limited by the type of load device which the high-voltage battery 40 is mounted onto.

Regarding the high-voltage battery 40, it is necessary to monitor whether the insulation resistance 41 is broken. If the insulation resistance 41 is broken, leakage current flows from the high-voltage battery 40 to its surrounding area. The leakage current becomes a cause for damaging the electronic components included in the load device or for electric shock accidents. Diagnosing whether the insulation resistance 41 is broken is performed by determining whether a resistance value of the insulation resistance 41 has been reduced to a predetermined reference value or below.

Meanwhile, the insulation resistance 41 of the high-voltage battery 40 may change due to a capacitance component existing between the high-voltage battery 40 and the load device, or environmental factors such as temperature, humidity and the like.

The control unit 10 may include a detection signal output terminal VDv, a control signal output terminal CXv, an analog digital converter ADC, and a switch control terminal (ON/OFF) configured to control an ON or OFF state of the switch SW. Functions of the detection signal output terminal VDv and the control signal output terminal CXv will be explained in detail hereinafter. The control unit 10 may be a micro controller unit or a central processing unit (CPU).

The insulation resistance measuring device 1 may include a power supply 12 so as to supply a driving voltage Vdd to the control unit 10 and the current detection circuit 20. The power supply 12 receives commercial power or power provided from the load device, and converts the received power into a driving voltage Vdd of a DC form and then supplies the converted power to each component that needs power.

The control unit 10 controls the switch SW to any one of an ON or OFF state through the switch control terminal (ON/OFF). Further, the control unit 10 may output a first high voltage signal or a first low voltage signal to the current detection circuit 20 through the detection signal output terminal VDv when the switch SW has turned to an ON state or OFF state.

Preferably, the first high voltage signal may be a voltage signal of substantially the same magnitude of the voltage level of the driving voltage Vdd being applied to the control unit 10 and the current detection circuit 20 by the power supply 12, and the first low voltage signal may be a ground Gnd signal.

The control unit 10 may detect through the current detection circuit 20 the leakage current of the high-voltage battery 40 flowing to the insulation resistance measuring device 1 side through the parameter resistance 30 in each state while controlling the switch SW to an ON or OFF state, and receive input of a voltage being applied between both ends of a shunt resistance RS inside the current detection circuit 20 by the leakage current as digital signals through the ADC.

The control signal output terminal CXv is a terminal that outputs a voltage control signal capable of controlling the output voltage of the current detection circuit 20 so that the magnitude of the voltage output from the current detection circuit 20 (corresponding to the voltage being applied between the both ends of the shunt resistance RS) is included in a predetermined optimal operation voltage range of the ADC. The voltage control signal may be a second high voltage signal or a second low voltage signal. The voltage control signal may consist of a plurality of signals, each signal being any one of a second high voltage signal and a second low voltage signal.

Here, the second high voltage signal may be substantially the same voltage signal as the driving voltage Vdd, and the second low voltage signal may be a ground Gnd signal.

Preferably, when the operating voltage of the ADC is 5V, the predetermined optimal operating voltage range may be set to a range of 0.5V to 4.5V.

The control unit 10 may control the switch SW that connects the insulation resistance measuring device 1 to the negative electrode terminal of the high-voltage battery 40 through the switch control terminal (ON/OFF) to an ON or OFF state.

In the case where the switch SW has turned to an ON or OFF state by control of the control unit 10, when the first high voltage signal or the first low voltage signal is output from the detection signal output terminal VDv, the current detection circuit 20 may detect the voltage being applied between both terminals of the shunt resistance RS due to the leakage current of the high-voltage battery 40 in response to each signal output and output the detected voltage to the ADC of the control unit 10.

The control unit 10 may receive, through the ADC, input of the voltage being applied between the both terminals of the shunt resistance RS from the current detection circuit 20 through ON or OFF control of the switch SW, and then calculate the resistance value of the insulation resistance 41 quantitatively using an insulation resistance calculating formula predefined in consideration of the connection relations of the circuit elements constituting the current detection circuit 20.

Preferably, the resistance value of the insulation resistance 41 may be calculated when the switch SW is in an ON state and an OFF state, respectively.

Figure 2:
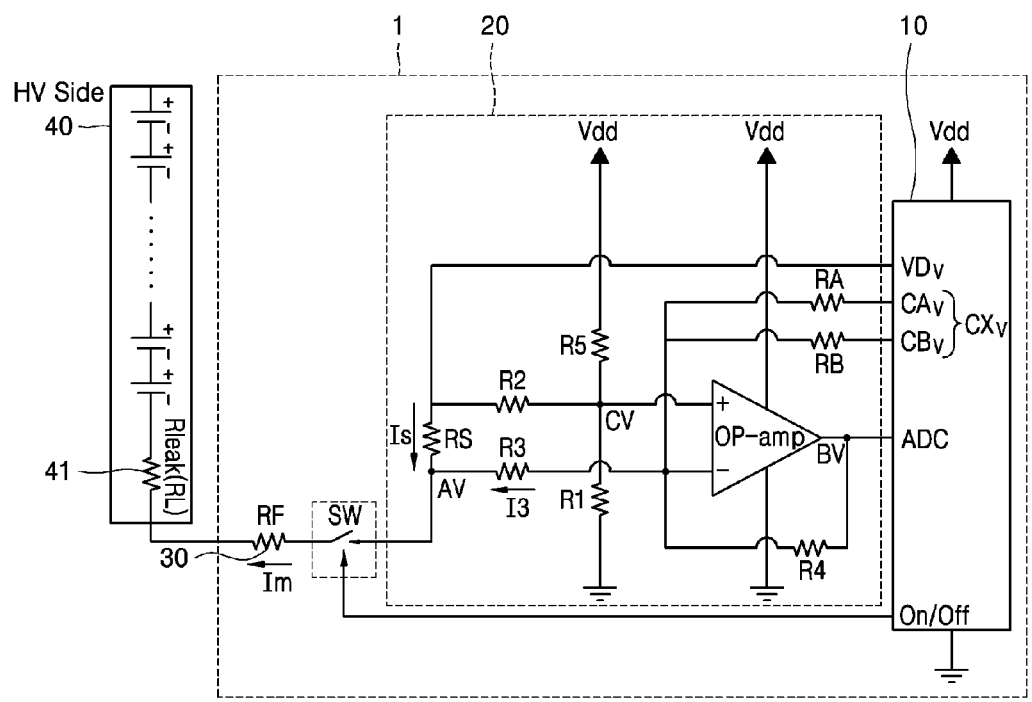
FIG. 2 is a circuit diagram specifically illustrating the insulation resistance measuring device according to an embodiment of the present disclosure.

FIG. 2 is a specific circuit diagram of the insulation resistance measuring device 1 according to an embodiment of the present disclosure.

Referring to FIG. 2, the current detection circuit 20 includes an operational amplifier (OP-amp) connected to the shunt resistance RS. Preferably, a non-inverting terminal (+) and an inverting terminal (−) of the operational amplifier (OP-amp) are connected to both terminals of the shunt resistance RS through a first connecting resistance R2 and a second connecting resistance R3, respectively. The non-inverting terminal (+) of the operational amplifier (OP-amp) is connected to an intermediate connecting node CV between a first voltage distribution resistance R1 and a second voltage distribution resistance R5.

Preferably, the shunt resistance RS is connected to the parameter resistance 30 through the switch SW. Therefore, when the switch SW is turned to an ON state, at least a portion of the leakage current of the high-voltage battery 40 flowing through the parameter resistance 30 flows through the shunt resistance RS. The leakage current flows when the insulation of the high-voltage battery 40 is broken. When the insulation is broken, the resistance value of the insulation resistance 41 decreases to a predetermined reference value or below.

To the inverting terminal (−) of the operational amplifier (OP-amp), a control resistance that applies a voltage control signal so that the magnitude of the output voltage of the operational amplifier (OP-amp) is included in a predetermined range is connected.

Here, the predetermined range corresponds to the optimal operating voltage range of the ADC.

Preferably, the control resistance includes at least a first control resistance RA and a second control resistance RB. One end of the first control resistance RA and the second control resistance RB are connected to the inverting terminal (−) of the operational amplifier (OP-amp). Further, preferably, the first control resistance RA and the second control resistance RB are connected in parallel to each other. The number of the control resistances is not limited to two, and thus its number may increase to three or more. When there are a large number of control resistances, it is possible to control the output voltage of the operational amplifier (OP-amp) more minutely. When the number of the control resistances increases, the number of the terminals constituting the control signal output terminal CXv may also increase correspondingly.

Preferably, the control signal output terminal CXv of the control unit 10 includes a first control signal output terminal CAv and a second control signal output terminal CBv that selectively output a second high voltage signal or a second low voltage signal to the first control resistance RA and the second control resistance RB, respectively.

Here, the number of the terminals constituting the control signal output terminal CXv may vary depending on the number of the control resistances. That is, when there are three control resistances, the number of terminals constituting the control signal output terminal CXv may also be three.

Meanwhile, the output terminal and the non-inverting terminal (−) of the operational amplifier (OP-amp) are connected to each other through a feedback resistance R4. Further, to the operational amplifier (OP-amp), the driving power Vdd supplied from the power supply 12 is applied. Further, the driving power Vdd may be decreased by the ratio of the first voltage distribution resistance R1 and the second voltage distribution resistance R5, and be applied to the non-inverting terminal (+) of the operational amplifier (OP-amp).

Further, the operational amplifier (OP-amp) outputs the voltage being applied between the both terminals of the shunt resistance RS, when at least a portion of the leakage current flows through the shunt resistance RS, to the input terminal of the ADC connected to the node BV at the output terminal of the operation amplifier (OP-amp).

The equation representing the voltage Bv of the node BV to which the output voltage of the operational amplifier (OP-amp) is being applied may be derived through the following process.

First, when the Kirchhoff's current law is applied in the inverting terminal (−) of the operational amplifier (OP-amp), the equation of the first line included in Equation 1 below is derived. Further, when the equation of the first line is arranged according to the Ohm's law, the equation appearing in the second line of Equation 1 below is obtained.

Here, since the non-inverting terminal (+) and the inverting terminal (−) of the operational amplifier (OP-amp) are virtually shorted, it may be assumed that the voltage of both terminals are the same. That is, the voltage being applied to the inverting terminal (−) may be regarded to be the same as the voltage Cv being applied to the node CV. According to such an assumption, when the equation of the second line is arranged with respect to the voltage Bv of the node BV, it is possible to derive the equation of the last line included in Equation 1 below.

$$I_{RA} + I_{RB} + I_{R4} - I3 = 0 \quad \text{[Equation 1]}$$

$$\frac{CAv - Cv}{RA} + \frac{CBv - Cv}{RB} + \frac{Bv - Cv}{R4} - \frac{(Cv - Av)}{R3} = 0$$

$$\frac{Bv - Cv}{R4} = \frac{Cv - CAv}{RA} + \frac{Cv - CBv}{RB} + \frac{Cv - Av}{R3}$$

$$Bv = Cv + \frac{R4 \cdot (Cv - CAv)}{RA} + \frac{R4 \cdot (Cv - CBv)}{RB} + \frac{R4 \cdot (Cv - Av)}{R3}$$

$$\therefore Bv = Cv + R4 \cdot \left[\frac{(Cv - CAv)}{RA} + \frac{(Cv - CBv)}{RB} + \frac{(Cv - Av)}{R3}\right]$$

In the above Equation, $I_{RA}$ is the current flowing in the first control resistance RA, $I_{RB}$ is the current flowing in the second control resistance RB, $I_{R4}$ is the current flowing in the feedback resistance R4, and I3 is the current flowing in the second connecting resistance R3. Further, CAv is the output voltage of the first control signal output terminal CAv, and CBv is the output voltage of the second control signal output terminal CBv. Bv is the voltage of the node BV, Av is the voltage of the node AV, and Cv is the voltage of the node CV. Further, RA is the resistance value of the first control resistance, RB is the resistance value of the second control resistance, R4 is the resistance value of the feedback resistance, and R3 is the resistance value of the second connecting resistance.

Next, the equation for calculating the voltage Av being applied to the node AV is derived as follows.

First, when the Kirchhoff's current law is applied to the node AV, the equation of the first line included in Equation 2 below is derived. Further, when the equation of the first line is arranged according to the Ohm's law, the equation of the second line of Equation 2 is obtained.

Here, since the non-inverting terminal (+) and the inverting terminal (−) of the operational amplifier (OP-amp) are virtually shorted, it may be assumed that the voltage of both terminals are the same. Further, since the non-inverting terminal (+) and the inverting terminal (−) have infinite input impedance, the current being input to each terminal may be regarded as 0.

When the equation of the second line is arranged with respect to the voltage Av, a formula for the voltage Av being applied to the node AV is obtained.

$$IS + I3 = Im \quad \text{[Equation 2]}$$

$$\frac{VDv - Av}{RS} + \frac{Cv - Av}{R3} = \frac{Av + EB}{RF + RL}$$

$$\frac{VDv}{RS} + \frac{Cv}{R3} - \frac{EB}{RF + RL} = \frac{Av}{RF + RL} + \frac{Av}{RS} + \frac{Av}{R3}$$

$$\frac{VDv}{RS} + \frac{Cv}{R3} - \frac{EB}{RF + RL} =$$

$$Av\left\{\frac{RS \cdot R3 + (RF + RL) \cdot R3 + (RF + RL) \cdot R2}{(RF + RL) \cdot (RS) \cdot (R3)}\right\}$$

$$Av = \frac{VDvR3 \cdot (RF + RL) + Cv \cdot RS \cdot (RF + RL) - EB \cdot RS \cdot R3}{(RF + RL) \cdot (RS) \cdot (R3)} \cdot$$

$$\frac{(RF + RL) \cdot RS \cdot R3}{RS \cdot R3 + (RF + RL) \cdot R3 + (RF + RL) \cdot R2}$$

$$Av = \frac{VDvR3 \cdot (RF + RL) + Cv \cdot RS \cdot (RF + RL) - EB \cdot RS \cdot R3}{RS \cdot R3 + (RF + RL) \cdot R3 + (RF + RL) \cdot R2}$$

$$\therefore Av = \frac{(VDvR3 + Cv) \cdot (RF + RL) - EB \cdot RS \cdot R3}{(RF + RL) \cdot (R3 + RS) + RS \cdot R3}$$

In the above equation, IS is the current flowing in the shunt resistance RS, I3 is the current flowing in the second connecting resistance R3, Im is the leakage current flowing in the parameter resistance RF, VDv is the output voltage of the detection signal output terminal, EB is the voltage of the high-voltage battery 40, CAv is the output voltage of the first control signal output terminal CAv, CBv is the output voltage of the second control signal output terminal CBv, Bv is the voltage of the node BV, Av is the voltage of the node AV, Cv is the voltage of the node CV, RA is the resistance value of the first control resistance, RB is the resistance value of the second control resistance, R4 is the resistance value of the feedback resistance, R3 is the resistance value of the second connecting resistance, RL is the resistance value of the insulation resistance, and RF is the resistance value of the parameter resistance.

Next, the equation for calculating the voltage Cv being applied to the node CV is derived as follows. First, when the Kirchhoff's current law is applied in the node CV, the equation of the first line included in Equation 3 below is derived. Further, when the equation of the first line is arranged according to the Ohm's law, the equation indicated in the second line of Equation 3 is obtained.

Here, since the non-inverting terminal (+) and the inverting terminal (−) of the operational amplifier (OP-amp) are virtually shorted, it may be assumed that the voltage of both terminals are the same. Further, since the non-inverting terminal (+) and the inverting terminal (−) have infinite input impedance, the current being input to each terminal may be regarded as 0.

When the equation of the second line is arranged with respect to the voltage Cv being applied to the node CV, a formula of the voltage Cv being applied to the node CV is obtained as indicated on the last line of Equation 3.

$$I_{R5} + I_{R2} = I_{R1} \quad \text{[Equation 3]}$$

$$\frac{V_{dd} - Cv}{R5} + \frac{VDv - CV}{R2} = \frac{Cv}{R1}$$

$$\frac{Vdd}{R5} + \frac{VDv}{R2} = Cv \cdot \left(\frac{1}{R1} + \frac{1}{R5} + \frac{1}{R2}\right)$$

$$\therefore Cv = \frac{R1 \cdot R2}{R1 \cdot R2 + R1 \cdot R5 + R5 \cdot R2} \cdot Vdd + \frac{R1 \cdot R5}{R1 \cdot R2 + R1 \cdot R5 + R5 \cdot R2} VDv$$

In the above equation, $I_{R5}$ is the current flowing in the first voltage distribution resistance, $I_{R2}$ is the current flowing in the first connecting resistance R2, $I_{R1}$ is the current flowing in the second voltage distribution resistance, Vdd is the driving voltage being applied to the first voltage distribution resistance, VDv is the output voltage of the detection signal output terminal, Cv is the voltage of the node CV, R1 is the resistance value of the second voltage distribution resistance, R2 is the resistance value of the first connecting resistance, and R5 is the resistance value of the first voltage distribution resistance.

Meanwhile, in the circuit illustrated in FIG. 2, the resistance ratio regarding each of the resistances may be set as follows such that an appropriate level of voltage is output from the operational amplifier (OP-amp) when at least a portion of the leakage current flows through the shunt resistance RS. However, the present disclosure is not limited thereto.

$$R2:(R1//R5)=R3:(R4//RA//RB)$$

$$R3:R4=1:1$$

$$RA:RB=1:2$$

$$(RA//RB):R4=1:2$$

Figure 3:
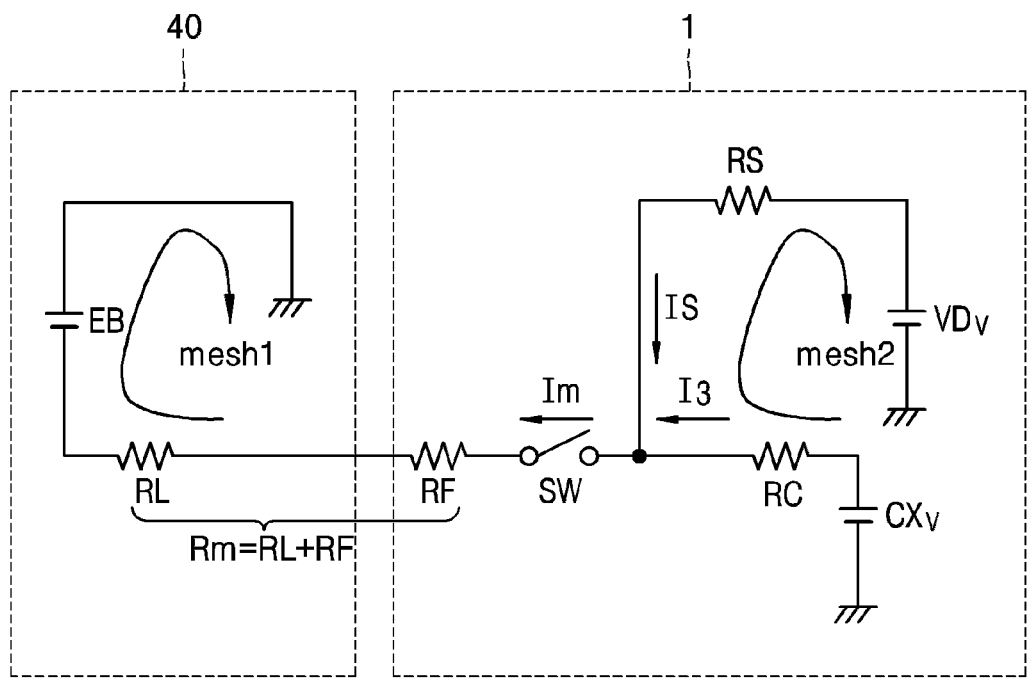
FIG. 3 is an equivalent circuit diagram schematically illustrating a case where a control unit of the insulation resistance measuring device illustrated in FIG. 2 controls a switch SW to an ON state.

FIG. 3 is an equivalent circuit diagram of a simplified circuit when the control unit 10 of the insulation resistance measuring device 1 illustrated in FIG. 2 controlled the switch SW to an ON state.

Hereinafter, with reference to FIG. 2 and FIG. 3, explanation will be made on the process of deriving a formula with respect to the resistance value of the insulation resistance RL, when the switch SW has turned to an ON state.

Referring to FIG. 3, the leakage current of the high-voltage battery 40 flowing in the insulation resistance RL and the parameter resistance RF is indicated as Im, and the current originated from the leakage current Im and flowing in the shunt resistance RS is indicated as IS, and the current flowing through the control resistance RC is indicated as I3.

In the case where leakage current occurred in the high-voltage battery 40, when the switch SW turns to an ON state, at least a portion of the current originated from the leakage current of the high-voltage battery 40 may flow in the circuit of the insulation resistance measuring device 1 as well.

In FIG. 3, the control resistance RC corresponds to the equivalent resistance of the first control resistance RA and the second control resistance RB connected in parallel through the first control signal output terminal CAv and the second control signal output terminal CBv in FIG. 2. Further, CXv, which is a DC voltage, represents the DC voltage consequently being applied to the control resistance RC, that is the equivalent resistance, according to the voltage level being output from the first control signal output terminal CAv and the second control signal output terminal CBv.

The magnitude of CXv, that is the DC voltage, may be predefined according to a combination of the voltage level being output from the first control signal output terminal CAv and the second control output terminal CBv, and be stored in the memory unit 11. Preferably, there is no particular limitation to the type of the memory unit 11 such as DRAM, SRAM, ROM, EEPROM, Flash Memory, Register and the like as long as it is a device where information can be stored.

Here, the control unit 10 may selectively output a second high voltage signal or a second low voltage signal through the first control signal output terminal CAv and the second control signal output terminal CBv.

Preferably, the second high voltage signal may be a voltage having substantially the same magnitude as the driving voltage Vdd, and the second low voltage signal may be a ground Gnd voltage.

According to one aspect, in the case where the first control signal output terminal CAv outputs the second high voltage signal and the second control signal output terminal CBv outputs the second high voltage signal, the control resistance Rc is substantially the same as the equivalent resistance determined from the circuit having a structure where both the first control resistance RA and the second control resistance RB are connected to the DC voltage that applies s a high voltage Vdd.

According to another aspect, in the case where the first control signal output terminal CAv outputs the second high voltage signal and the second control signal output terminal CBv outputs the second low voltage signal, the control resistance Rc is substantially the same as the equivalent resistance determined from the circuit having a structure where the first control resistance RA is connected to the DC voltage that applies the high voltage Vdd and the second control resistance RB is connected to the ground that applies the low voltage Gnd.

According to yet another aspect, in the case where the first control signal output terminal CAv outputs the second low voltage signal and the second control signal output terminal CBv outputs the second high voltage signal, the control resistance Rc is substantially the same as the equivalent resistance determined from the circuit having a structure where the first control resistance RA is connected to the ground that applies the low voltage Gnd and the second control resistance RB is connected to the DC voltage that applies the high voltage Vdd.

According to yet another aspect, in the case where the first control signal output terminal CAv outputs the second low voltage signal and the second control signal output terminal CBv outputs the second low voltage signal, the control resistance RC is substantially the same as the equivalent resistance determined from the circuit having a structure where both the first control resistance RA and the second control resistance RB are connected to the ground that applies the low voltage Gnd.

Preferably, in order to enable the current measurement circuit 20 to stably output the voltage applied between the both terminals of the shunt resistance RS to the ADC when at least a portion of the current originated from the leakage current of the high-voltage battery 40 flew through the shunt resistance RS, the control unit 10 selectively applies the second high voltage signal and the second low voltage signal to the first control signal output terminal CAv and the second control signal output terminal CBv, thus varying the voltage being applied to the inverting terminal (−) of the operational amplifier (OP-amp) connected to the first control resistance RA and the second control resistance RB connected in parallel through the first control signal output terminal CAv and the second control signal output terminal CBv.

Preferably, the control unit 10 may control the voltage level being output from the first control signal output terminal CAv and the second control signal output terminal CBv such that the magnitude of the voltage being output from the operational amplifier (OP-amp) may be included within the optimal operating voltage range of the ADC.

For example, the control unit 10 may selectively output the second high voltage signal or the second low voltage signal through the first control signal output terminal CAv and the second control signal output terminal CBv according to a combination of predetermined order (11, 10, 01, 00), so that the output voltage of the operational amplifier (OP-amp) is included in the range of 0.5V to 4.5V, that is the optimal operating voltage range of the ADC.

Preferably, the level controlling of the voltage signal being output from the first control signal output terminal CAv and the second control signal output terminal CBv as mentioned above may be executed every time a condition where the output voltage of the operational amplifier (OP-amp) deviates from the optimal operating voltage range of the ADC is established.

Meanwhile, without being limited to the first control signal output terminal CAv and the second control signal output terminal CBv, the control unit 10 may be further provided with more control signal output terminals. When the control unit 10 has more control signal output terminals as aforementioned, the output voltage of the operational amplifier (OP-amp) may be controlled more minutely.

Referring to FIG. 3 again, the equation for calculating the magnitude of the leakage current Im of the high-voltage battery 40 may be obtained by applying the Kirchhoff's current law in a common node where the switch SW, the shunt resistance RS and the control resistance RC are connected to one another.

Of the equations included in Equation 4 below, the equation on the first line calculates the magnitude of the leakage current Im. Further, the current IS flowing in the shunt resistance RS may be obtained when the Kirchhoff's voltage rule (KVL) is applied with respect to mesh 1 and mesh 2 indicated in FIG. 3 to derive two simultaneous equations, and the simultaneous equations are solved with respect to the current IS to obtain the value thereof.

Of the equations included in Equation 4 below, the equation of the last line corresponds to the equation for calculating the magnitude of the current IS flowing through the shunt resistance RS.

$$Im = IS + I3 \quad \text{[Equation 4]}$$

$$Rm = RL + RF$$

$$IS = \frac{(RC \cdot VDv + RC \cdot EB) + (Rm \cdot VDv - Rm \cdot CXv)}{RS \cdot RC + Rm \cdot RC + RS \cdot Rm}$$

In the above equation, Im is the leakage current of the high-voltage battery 40, IS is the current flowing in the shunt resistance Rs, I3 is the current flowing in the second connecting resistance R3, VDv is the output voltage of the detection signal output terminal, EB is the voltage of the high-voltage battery 40, CXv is the voltage consequently being applied to the control resistance RC, that is the equivalent resistance of the first control resistance RA and the second control resistance RB by the voltage being output from the first and second control signal output terminal CAv, CBv, RS is the resistance value of the shunt resistance, RL is the resistance value of the insulation resistance, RF is the resistance value of the parameter resistance, Rm is the summed resistance value of insulation resistance RL and parameter resistance RF, and RC is the resistance value of the control resistance, that is the equivalent resistance of the first control resistance RA and the second control resistance RB.

Meanwhile, in a state where the control unit 10 has turned on the switch SW, when the voltage difference being applied between the both terminals of the shunt resistance RS when the first high voltage signal and the first low voltage signal are each applied to the detection signal output terminal VDv at time intervals is indicated as the first voltage change amount ΔV(on), it is possible to derive the equation of the first and second line included in Equation 5 below.

Here, looking at the derived equation in the second line, one can see that the effect of the voltage EB of the high-voltage battery 40 has disappeared since the voltage parameter EB of the high-voltage battery 40 was deleted.

When the second equation of Equation 5 is arranged with respect to Rm, and the arranged equation is substituted into equation: Rm=RL+RF, it is possible to obtain an insulation resistance formula capable of calculating the resistance value of the insulation resistance RL when the switch SW is in an ON state as in the equation of the last line.

$$\Delta V(\text{on}) = \{IS(VDv_{on}) - IS(VDv_{off})\} \cdot RS \quad \text{[Equation 5]}$$

$$= \frac{RC \cdot Vdd + Rm \cdot Vdd - Rm \cdot \Delta CXv}{RS \cdot RC + Rm \cdot RC + RS \cdot Rm} \cdot RS$$

$$Rm = \frac{(Vdd - \Delta V(\text{on})) \cdot RC \cdot RS}{\Delta V(\text{on}) \cdot (RS + RC) - RS \cdot (Vdd - \Delta CXv)}$$

$$RL = \frac{(Vdd - \Delta V(\text{on})) \cdot RC \cdot RS}{\Delta V(\text{on}) \cdot (RS + RC) - RS \cdot (Vdd - \Delta CXv)} - RF$$

In the above equation, the first voltage change amount ΔV(on) corresponds to the difference of voltages being applied to the both terminals of the shunt resistance RS when the first high voltage signal and the first low voltage signal are applied to the shunt resistance RS at different time points through the detection signal output terminal VDv in a state where the control unit 10 has controlled the switch SW to an ON state.

In the formula of the first voltage change amount ΔV(on), $IS(VDv_{on})$ is the magnitude of the current IS flowing in the shunt resistance RS in the case where the output voltage of the detection signal output terminal VDv is the first high voltage signal. Further, IS(VDv$_{off}$) is the magnitude of the current IS flowing in the shunt resistance RS in the case where the output voltage of the detection signal output terminal VDv is the first low voltage signal.

Further, ΔCXv is the control voltage change amount consequently being applied to the control resistance RC, that is the equivalent resistance of the first control resistance RA and the second control resistance RB by the voltage being output from the first and second control signal output terminal CAv, CBv while the control unit 10 applies the first high voltage signal and the first low voltage signal to the shunt resistance RS through the detection signal output terminal VDv at different time points.

That is, the control voltage change amount ΔCXv corresponds to the difference between the voltage being applied to the control resistance RC while the first low voltage signal is being applied to the shunt resistance RS through the detection signal output terminal VDv and the voltage being applied to the control resistance RC while the first high voltage signal is being applied to the shunt resistance RS through the detection signal output terminal VDv.

When the magnitude of the output voltage By of the operational amplifier (OP-amp) deviates from the optimal operating voltage range of the ADC, the control unit 10 may adaptively change the level of the voltage being output from the first and second control signal output terminals CAv, CBv, wherein the voltage that has been consequently adjusted may be considered as the voltage to be applied to the control resistance RC.

In the above equation, RS is the resistance value of the shunt resistance, RL is the resistance value of the insulation resistance, RF is the resistance value of the parameter resistance, Rm is the summed resistance value of insulation resistance RL and parameter resistance RF, and RC is the resistance value of the control resistance, that is the equivalent resistance of the first control resistance RA and the second control resistance RB.

The control unit 10 may quantitatively determine the resistance value of the insulation resistance RL of the high-voltage battery 40 using the equation defined as the last line of Equation 5 above.

In the formula of the insulation resistance RL, the resistance values may be predefined and stored in the memory unit 11. Further, Vdd corresponds to the driving voltage. Further, the control voltage change amount ΔCXv may be predetermined by combination of the voltage level being output from the first and second control signal output terminal CAv, CBv.

Further, the control unit 10 may determine the first voltage change amount ΔV(on) based on the differences of the voltage By measured through the ADC connected to the output terminal of the operational amplifier (OP-amp), when the first high voltage signal and the first low voltage signal are applied to the shunt resistance RS at time intervals through the detection signal output terminal VDv.

Further, the control unit 10 may simply determine the resistance value of the insulation resistance RL from the predefined insulation resistance formula as Equation 5 using the first voltage change amount ΔV(on).

Further, the control unit 10 may store the determined resistance value of the insulation resistance RL in the memory unit 11 or output the same to an external control device 50 through a communication interface. Further, when the magnitude of the determined insulation resistance RL is smaller than a predetermined reference value, the control unit 10 may generate an alarm message indicating that the insulation of the high-voltage battery 40 has been broken, and transmit the same to the external control device 50 through the communication interface.

Then, the external control device 50 may display the alarm message visually through the display or acoustically through the speaker. For this purpose, the display and the speaker may be electrically coupled to the external control device 50.

Figure 4:
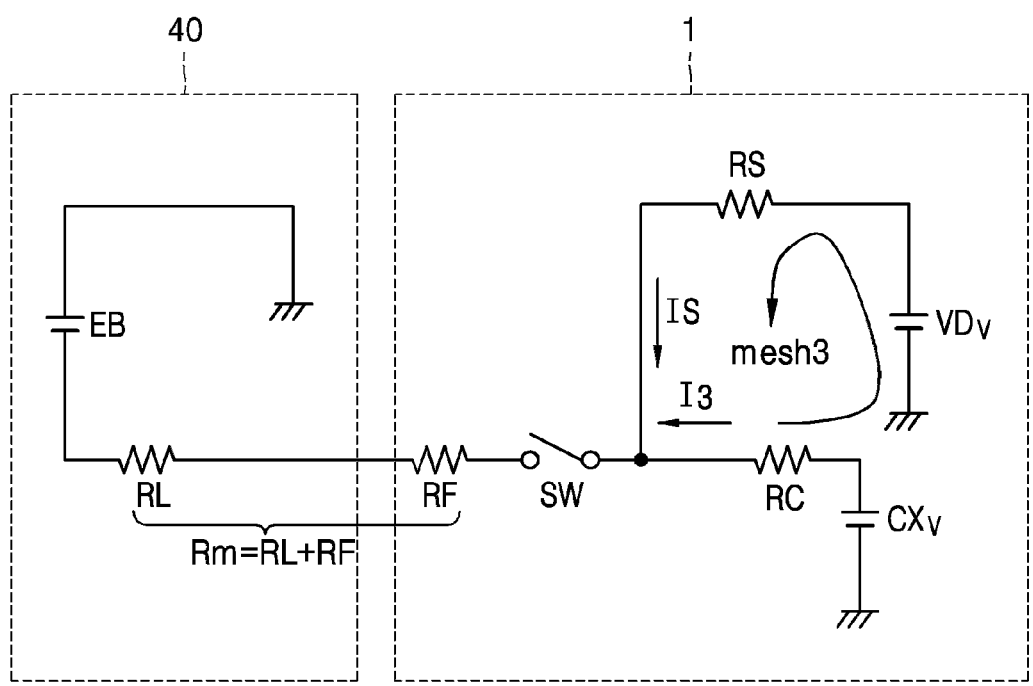
FIG. 4 is an equivalent circuit diagram schematically illustrating a case where the control unit of the insulation resistance measuring device illustrated in FIG. 2 controls the switch SW to an OFF state.

FIG. 4 is an equivalent circuit diagram of a simplified circuit of FIG. 2 when the control unit 10 of the insulation resistance measuring device 1 illustrated in FIG. 2 controlled the switch SW to an OFF state.

Hereinafter, with reference to FIG. 2 and FIG. 4, explanation will be made on the process of deriving the insulation resistance formula that may be used in obtaining the insulation resistance RL of the high-voltage battery 40 when the switch SW has turned to an OFF state. Referring to FIG. 4, the current flowing in the shunt resistance RS is indicated as IS, and the current flowing in the control resistance RC, that is the equivalent resistance of the first control resistance RA and the second control resistance RB is indicated as I3.

When the Kirchhoff's voltage rule (KVL) is applied with reference to mesh 3 indicated in FIG. 4, the equation of the first line included in Equation 6 below may be derived.

The current IS flowing in the shunt resistance RS may be derived as in the equation of the third line using the equation of the second line.

Meanwhile, a second voltage change amount ΔV(off), that is the difference of voltage being applied to both terminal of the shunt resistance RS when a third high voltage signal Vdd and a third low voltage signal are applied to the shunt resistance RS through the detection signal output terminal VDv at time intervals in a state where the control unit 10 turned off the switch SW, may be determined by the equation of the last line included in Equation 6 below.

$$VDv - CXv = IS \cdot RS - I3 \cdot RC \qquad \text{[Equation 6]}$$

$$IS = -I3$$

$$IS = \frac{VDv - CXv}{RS + RC}$$

$$IS(VDv_{on}) - IS(VDv_{off}) = \frac{Vdd - \Delta CXv}{RS + RC}$$

$$\Delta V(\text{off}) = \{IS(VDv_{on}) - IS(VDv_{off})\} \cdot RS = \frac{Vdd - \Delta CXv}{RS + RC} \cdot RS$$

In the above equation, CXv is the voltage being applied to the control resistance RC, that is the equivalent resistance of the first control resistance RA and the second control resistance RB, when the output voltage of the detection signal output terminal VDv is the third high voltage signal or the third low voltage signal.

Preferably, the third high voltage signal may be a voltage signal of substantially the same magnitude of the voltage level of the driving voltage Vdd being applied by the power supply 12 to the control unit 10 and the current detection circuit 20, and the third low voltage signal may be a ground Gnd signal.

Here, when the magnitude of the voltage By being output from the operational amplifier (OP-amp) deviates from the optimal operating voltage range of the ADV, CXv may be changed as the control unit 10 controls the voltage level being output from the first and second control signal output terminal CAv, CBv.

Further, the control voltage change amount ΔCXv corresponds to the amount of change of the control voltage CXv being applied to the control resistance RC, that is the equivalent resistance of the first control resistance RA and the second control resistance RB, from the first and second control signal output terminal CAv, CBv while applying the third high voltage signal and the third low voltage signal to the shunt resistance RS through the detection signal output terminal VDv at time intervals in a state where the control unit 10 turned off the switch SW.

Further, IS represents the current flowing in the shunt resistance RS, $IS(VDv_{on})$ represents the current flowing through the shunt resistance RS in the case where the output voltage of the detection signal output terminal VDv is the third high voltage signal, and $IS(VDv_{off})$ represents the current flowing through the shunt resistance RW in the case where the output voltage of the detection signal output terminal VDv is the third low voltage signal.

Further, RS is the resistance value of the shunt resistance, and RC is the resistance value of the control resistance, that is the equivalent resistance of the first control resistance RA and the second control resistance RB.

Further, the second voltage change amount ΔV(off) is the amount of change of the voltage being applied to the shunt resistance RS when the third high voltage signal and the third low voltage signal are applied to the shunt resistance RS through the detection signal output terminal VDv at time intervals in a state where the control unit 10 turned off the switch SW.

The control unit 10 may apply the third high voltage signal and the third low voltage signal to the shunt resistance RS through the detection signal output terminal VDx at time intervals in a state where the switch SW is turned off, and measure the second voltage change amount ΔV(off) through the ADC connected to the output terminal of the operational amplifier (OP-amp).

Meanwhile, when the difference between the first voltage change amount ΔV(on) measured through the operational amplifier (OP-amp) when the switch SW is in an ON state and the second voltage change amount ΔV(off) measured through the operational amplifier (OP-amp) when the switch SW is in an OFF state is defined as a third voltage change amount ΔVX, the third voltage change amount ΔVX may be represented as the equation of the first and second line included in Equation 7 below.

Here, when the equations of the first and second line of Equation 5 are substituted into the first voltage change amount ΔV(on) and the equation of the last line of Equation 6 is substituted into the second voltage change amount ΔV(off), the equation of the third line of Equation 7 is obtained.

Further, when the equation of the third line is arranged with respect to Rm, the equation of the fourth line of Equation 7 is obtained. Further, since Rm corresponds to the summed resistance value of the insulation resistance RL and the parameter resistance RF, when the resistance value of the parameter resistance RF is subtracted from the equation of the fourth line, it is possible to obtain a formula capable of quantitatively determining the resistance value of the insulation resistance RL as in the fifth line of Equation 7.

$$\Delta VX = \Delta V(\text{on}) - \Delta V(\text{off}) \quad \text{[Equation 7]}$$

$$= \left[ \frac{RC \cdot Vdd + Rm \cdot Vdd - Rm \cdot \Delta CXv}{RS \cdot RC + Rm \cdot RC + RS \cdot Rm} - \frac{Vdd - \Delta CXv}{RS + RC} \right] \cdot RS$$

-continued $$\Delta VX = \frac{RS \cdot (RC^2 \cdot Vdd + RS \cdot RC \cdot \Delta CXv)}{(RS \cdot RC + Rm \cdot RC + RS \cdot Rm) \cdot (RS + RC)}$$

$$Rm = \frac{RS \cdot RC \cdot (RC \cdot Vdd + RS \cdot \Delta CXv) - \frac{RS \cdot RC(RS + RC) \cdot \Delta VX}{\Delta VX \cdot (RS + RC)^2}}$$

$$RL = \frac{RS \cdot RC \cdot (RC \cdot Vdd + RS \cdot \Delta CXv) - \frac{RS \cdot RC \cdot (RS + RC) \cdot \Delta VX}{\Delta VX \cdot (RS + RC)^2}} - RF$$

In the above equation, ΔV(on), ΔV(off), ΔVX and ΔCXv are substantially the same as defined above.

Further, RS is the resistance value of the shunt resistance, RC is the resistance value of the control resistance, that is the equivalent resistance of the first control resistance RA and the second control resistance RB, RL is the resistance value of the insulation resistance, RF is the resistance value of the parameter resistance, and Rm is the summed resistance value of the insulation resistance RL and the parameter resistance RF.

The control unit 10 may determine the first voltage change amount ΔV(on) and the second voltage change amount ΔV(off) through the ADC connected to the output terminal of the operational amplifier (OP-amp) while controlling the switch SW to an ON state or OFF state.

That is, the first voltage change amount ΔV(on) corresponds to the output voltage change amount of the operational amplifier (OP-amp) when the switch SW is in an ON state, and the second voltage change amount ΔV(off) corresponds to the output voltage change amount of the operational amplifier (OP-amp) when the switch SW is in an OFF state. Further, the control unit 10 may determine ΔVX from ΔV(on) and ΔV(off).

Further, the control unit 10 may quantitatively determine the resistance value of the insulation resistance RL by substituting the predefined resistance value and the driving voltage Vdd, the third voltage change amount ΔVX calculated from the first voltage change amount ΔV(on) and the second voltage change amount ΔV(off), and the control voltage change amount ΔCXv determined according to the change of the voltage level being output from the first and second control signal output terminal CAv, CBv into the insulation resistance formula of Equation 7.

The control unit 10 may store the resistance value of the insulation resistance RL determined when the switch SW was in an OFF state in the memory unit 11. Further, when the resistance value of the insulation resistance RL is smaller than the predetermined reference value, the control unit 10 may generate an alarm message and output the same to the external control device 50 through a communication interface.

Upon receiving the alarm message from the control unit 10, the external control device 50 may display a message meaning that the insulation of the high-voltage battery 40 has been broken visually through the display or acoustically through the speaker.

Then, hereinbelow, a method of the control unit 10 determining the resistance value of the insulation resistance RL will be explained more specifically, with reference to FIG. 5 and FIG. 6.

Figure 5:
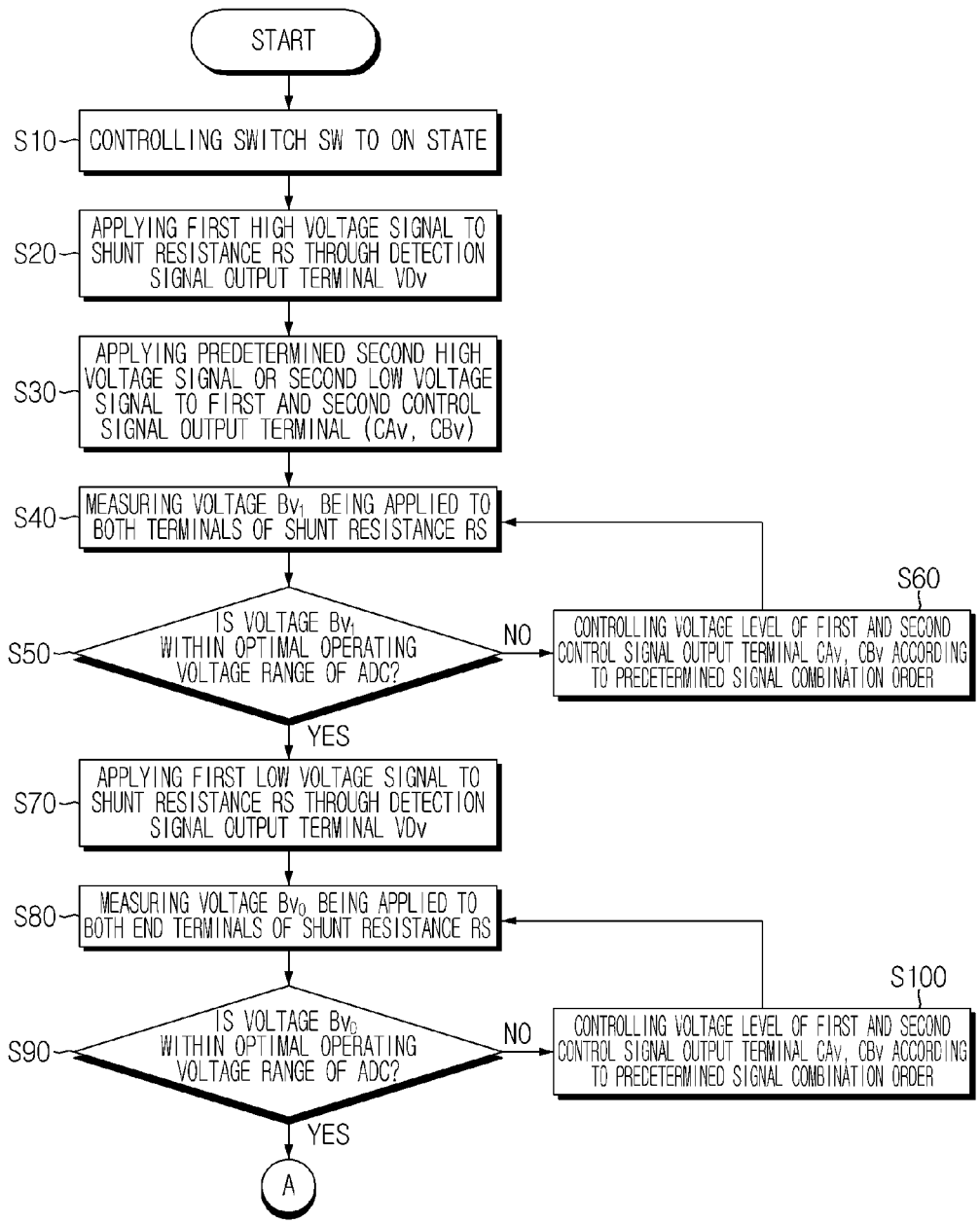
FIG. 5 and FIG. 6 are sequence diagrams illustrating a method for measuring insulation resistance when the switch SW is in an ON state according to an embodiment of the present disclosure.
Figure 6:
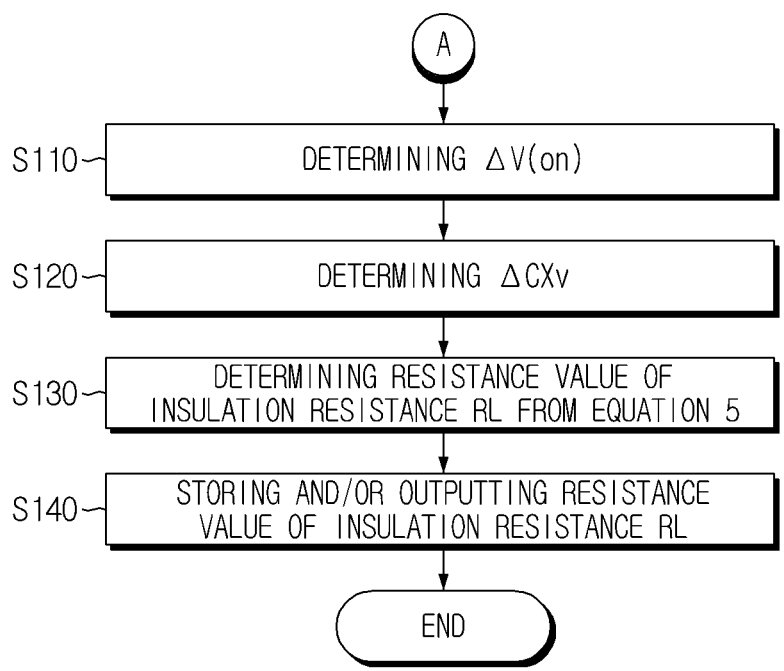

FIG. 5 and FIG. 6 are flowcharts illustrating the method where the control unit 10 determines the resistance value of the insulation resistance RL when the switch SW is in an ON state.

First, at step S10, the control unit 10 controls the switch SW to an ON state through the switch control terminal (ON/OFF).

Subsequently, at step S20, the control unit 10 applies the first high voltage signal to the shunt resistance RS through the detection signal output terminal VDv, and at step S30, applies the second high voltage signal or the second low voltage signal as predetermined to the first and second control signal output terminal CAv, CBv.

Subsequently, at step S40, the control unit 10 measures the voltage $Bv_1$ applied between the both terminals of the shunt resistance RS through the ADC connected to the output terminal of the operational amplifier (OP-amp).

Subsequently, at step S50, the control unit 10 determines whether the voltage $Bv_1$ belongs to the optimal operating voltage range of the ADC.

If it is determined at step S50 that the voltage $Bv_1$ belongs to the optimal operating voltage range of the ADC, the control unit 10 proceeds to the next step.

Preferably, when the operating voltage of the ADC is 5V, the optimal operating voltage range may be 0.5V to 4.5V.

On the other hand, if it is determined at step S50 that the voltage $Bv_1$ does not belong to the optimal operating voltage range of the ADC, the control unit 10 proceeds to step S60. That is, at step S60, the control unit 10 controls the voltage level of the first and second control signal output terminal CAv, CBv according to the predetermined signal combination order, and proceeds to step S40 again to measure the voltage $Bv_1$ and to determine whether the measured voltage $Bv_1$ belongs to the optimal operating voltage range of the ADC. Preferably, execution of steps S40, S50 and S60 is repeated until the measured voltage $Bv_1$ belongs within the optimal operating voltage range of the ADC.

When it is determined at step S50 that the voltage $Bv_1$ belongs to the optimal operating voltage range of the ADC, the control unit 10 applies the first low voltage signal to the shunt resistance RS through the detection signal output terminal VDv at step S70.

Subsequently, at step S80, the control unit 10 measures the voltage $Bv_0$ being applied between the both terminals of the shunt resistance RS through the ADC connected to the output terminal of the operating amplifier (OP-amp).

Subsequently, at step S90, the control unit 10 determines whether the voltage $Bv_0$ belongs to the optimal operating voltage range of the ADC.

If it is determined at step S90 that the voltage $Bv_0$ belongs to the optimal operating voltage range of the ADC, the control unit 10 proceeds to the next step. On the other hand, if it is determined at step S90 that the voltage $Bv_0$ does not belong to the optimal operating voltage range of the ADC, the control unit 10 proceeds to step S100.

At step S100, the control unit 10 controls the voltage level of the first and second control signal output terminal CAv, CBv according to the predetermined signal combination order, and proceeds to step S80 again to measure the voltage $Bv_0$ and to determine whether the measured voltage $Bv_0$ belongs to the optimal operating voltage range of the ADC. Preferably, execution of steps S80, S90 and S100 is repeated until the measured voltage $Bv_0$ belongs within the optimal operating voltage range of the ADC.

When it is determined at step S90 that the voltage $Bv_0$ belongs to the optimal operating voltage range of the ADC, at step S110, the control unit 10 determines the first voltage change amount $\Delta V(on)$ corresponding to the difference between the voltage $Bv_1$ measured through step S40 and the voltage $Bv_0$ measured through step S80.

Subsequently, at step S120, the control unit 10 determines the control voltage $CXv_1$ being applied to the control resistance RC from the signal combination of the first and second control signal output terminal CAv, CBv that makes the measured voltage $Bv_1$ belong to the optimal operating voltage range of the ADC. Further, the control unit 10 determines the control voltage $CXv_0$ being applied to the control resistance RC from the signal combination of the first and second control signal output terminal CAv, CBv that makes the measured voltage $Bv_0$ belong to the optimal operating voltage range of the ADC, and determines the control voltage change amount $\Delta CVx$ from $CXv_1$ and $CXv_0$.

Here, $CXv_1$ represents the DC voltage being applied to the control resistance RC corresponding to the equivalent resistance of the first control resistance RA and the second control resistance RB in the case where the signal combination of the first and second control signal output terminal CAv, CBv that makes the measured voltage $Bv_1$ belong to the optimal operating voltage range of the ADC is applied to the first control resistance RA and the second control resistance RB.

Further, $CXv_0$ represents the DC voltage being applied to the control resistance RC corresponding to the equivalent resistance of the first control resistance RA and the second control resistance RB in the case where the signal combination of the first and second control signal output terminal CAv, CBv that makes the measured voltage $Bv_0$ belong to the optimal operating voltage range of the ADC is applied to the first control resistance RA and the second control resistance RB.

The magnitude of the DC voltage may be predetermined according to the signal combination of the first and second control signal output terminal CAv, CBv through experiments and be stored in the memory unit 11, and the control 10 may identify the signal combination of the first and second control signal output terminal CAv, CBv applied to measurement of the voltage $Bv_0$, $Bv_1$ and determine $CXv_0$ and $CXv_1$ corresponding to the signal combination identified with reference to the memory unit 11.

Subsequently, at step S130, the control unit 10 quantitatively determines the resistance value of the insulation resistance RL from the insulation resistance formula of Equation 5 using the determined first voltage change amount $\Delta V(on)$ and the control voltage change amount $\Delta CVx$ and the predefined resistance values and the driving voltage Vdd.

Subsequently, at step S140, the control unit 10 may store the determined resistance value of the insulation resistance RL in the memory unit 11, or output the same to the external control device 50.

Further, although not illustrated in the drawings, when the resistance value of the insulation resistance RL determined at step S130 is smaller than the predetermined reference value, the control unit 10 may generate an alarm message indicating that the insulation of the high-voltage battery 40 has been broken, and output the same to the external control device 50 through a communication interface.

Then, the external control device 50 may display the alarm message visually through the display or acoustically through the speaker.

Figure 7:
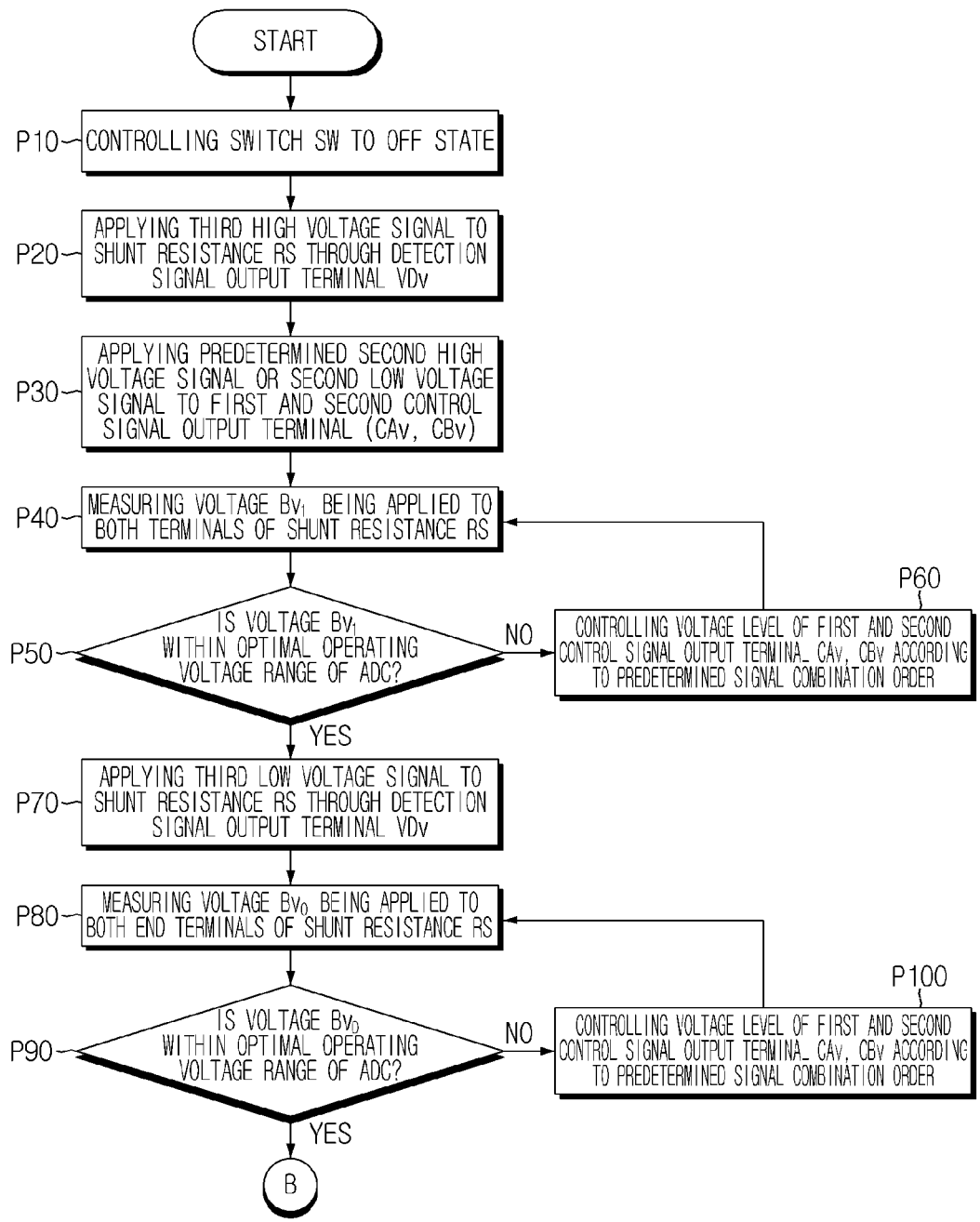
FIG. 7 and FIG. 8 are sequence diagrams illustrating a method for measuring insulation resistance when the switch SW is in an OFF state according to an embodiment of the present disclosure.
Figure 8:
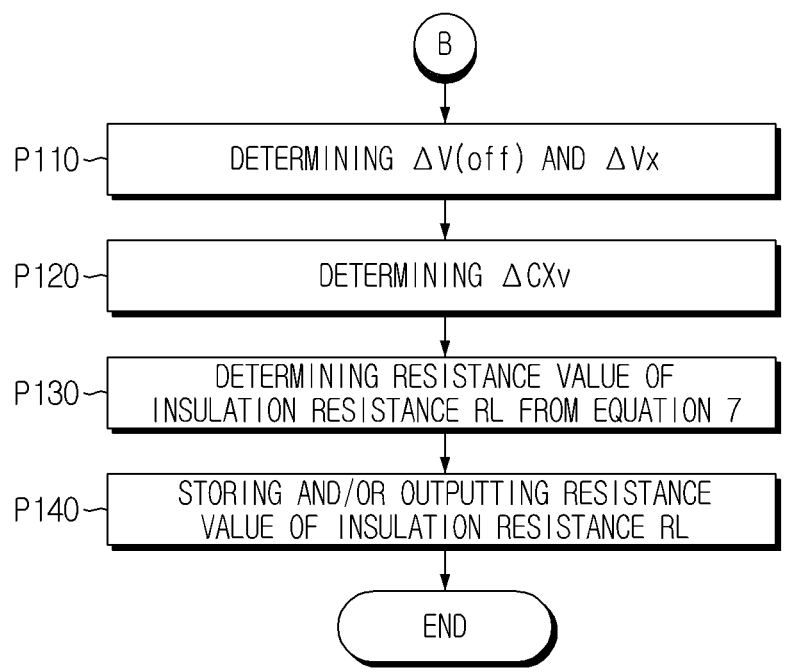

FIG. 7 and FIG. 8 are flowcharts illustrating a method for determining the resistance value of the insulation resistance RL when the switch SW is in an OFF state.

First, the control unit 10 controls the switch SW to an OFF state through the switch control terminal (ON/OFF).

Then, the control unit 10 sequentially proceeds step P20 to step P100 and applies the third high voltage signal and the third low voltage signal to the shunt resistance RS through the detection signal output terminal VDx at time intervals, and measures the voltage $Bv_1$, $Bv_0$ being applied to the both terminals of the shunt resistance RS within the optimal operating voltage range of the ADC through the ADC connected to the output terminal of the operational amplifier (OP-amp). Here, the voltage $Bv_1$ is the voltage being applied to the both terminals of the shunt resistance RS when the third high voltage signal is output through the detection signal output terminal VDx, and the voltage $Bv_0$ is the voltage being applied to the both terminals of the shunt resistance RS when the third low voltage signal is output through the detection signal output terminal VDx.

Since step P20 to step P100 are substantially the same as step S20 to step S100 explained above, repeated explanation will be omitted.

After measuring the voltage $Bv_1$, $Bv_0$ is completed, the control unit 10 determines the second voltage change amount $\Delta V(off)$ from the two measured voltages $Bv_1$, $Bv_0$ at step P110. Further, the control unit determines a third voltage change amount $\Delta VX$ corresponding to the difference between the first voltage change amount $\Delta V(on)$ determined at step S110 when the switch SW is in an ON state and the second voltage change amount $\Delta V(off)$.

Subsequently, at step P120, the control unit 10 determines the control voltage change amount $\Delta CVx$ in substantially the same method as step S120.

Subsequently, at step P130, the control unit 10 quantitatively determines the resistance value of the insulation resistance RL from the insulation resistance formula of Equation 7 using the determined third voltage change amount $\Delta VX$, the control voltage change amount $\Delta CVx$, the predefined resistance values and the driving voltage Vdd.

Subsequently, at step P140, the control unit 10 may store the determined resistance value of the insulation resistance RL in the memory unit 11, or output the same to the external control device 50.

Further, although not illustrated in the drawings, when the resistance value of the insulation resistance RL determined at step S130 is smaller than the predetermined reference value, the control unit 10 may generate an alarm message indicating that the insulation of the high-voltage battery 40 has been broken, and output the same to the external control device 50 through a communication interface.

Then, the external control device 50 may display the alarm message visually through the display or acoustically through the speaker.

In the present disclosure, at least one or more of various control logics of the control unit 10 may be combined, and the combined control logics may be written as a computer-readable code and recorded on a computer-readable recording medium.

The recording medium is not limited to any specific type, as long as it is accessible by a processor included in the computer. In one example, the recording medium may include at least one selected from the group consisting of ROM, RAM, register, CD-ROM, magnetic tape, hard disk, floppy disk, and optical data recording device.

Further, the code may be distributed to computers connected via network, and then stored and executed. Further, programmers in the technical field pertinent to the present disclosure will be easily able to envision functional programs, codes and code segments to implement the combined control logics.

In order to implement a variety of control logics including those described above, the control unit 10 may optionally include processor, application-specific integrated circuit (ASIC), other chipsets, logic circuit, register, communication modem, data processor, and the like, as known in the art. Further, when the control logic is implemented as software, the controller 10 may be implemented as a set of program modules. In this case, the program modules may be stored in a memory and executed by a processor. The memory may be inside or outside the processor, and may be connected to the processor in various well-known means.

In describing a variety of aspects of the present disclosure, the elements with names ending with 'unit' will have to be understood as the elements that are distinguished functionally, rather than being distinguished physically. Accordingly, the respective elements may be optionally incorporated with another element, or each of the elements may be divided into sub-elements such that the respective elements efficiently implement control logic(s). However, even when the elements are incorporated or divided, it will be obvious to those skilled in the art that the incorporated or divided elements also fall under the scope of the present disclosure, as long as the sameness of functions is acknowledged.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

INDUSTRIAL APPLICABILITY

According to the present disclosure, since insulation resistance is measured by using the operational amplifier (OP-amp), it is possible to measure the exact insulation resistance without being affected externally.

Further, it is possible to measure insulation resistance by connecting to the negative electrode terminal of the high-voltage battery. Therefore, since an expensive circuit component having excellent withstanding voltage properties is not needed, it is possible to measure insulation resistance more simply at minimum cost.

Further, since the effect of a voltage of the high-voltage battery is removed, it is possible to measure the exact insulation resistance.

What is claimed is:

1. A device for measuring insulation resistance of a battery, the device comprising:
   a parameter resistance of which one end is electrically connected to a negative electrode terminal of the battery;
   a current detection circuit including a shunt resistance connectable to the parameter resistance to enable at least a portion of leakage current of the battery flowing in the parameter resistance to flow, and an operational amplifier connected to both terminals of the shunt resistance and configured to detect and output voltage between both ends of the shunt resistance; and
   a control unit configured to determine the insulation resistance of the battery using a switch control terminal configured to control a switch connected between the parameter resistance and the shunt resistance to an ON or OFF state, a detection signal output terminal configured to selectively apply a first high voltage signal and a first low voltage signal to the shunt resistance, a control signal output terminal configured to apply a control voltage signal to the operational amplifier to adjust an output voltage of the operational amplifier within a predetermined range, an ADC connected to an output terminal of the operational amplifier, and a predefined insulation resistance formula that includes, as a parameter, a first voltage change being a difference of voltages being applied to both terminals of the shunt resistance amount when the first high voltage signal and the first low voltage signal are applied to the shunt resistance.

2. The device of claim 1, wherein the control signal output terminal includes a first and second control signal output terminal configured to selectively output a second high voltage signal and a second low voltage signal,
the current detection circuit includes a first and second control resistance connected to the first and second control signal output terminal, respectively, and
the first and second control resistance are connected parallel to each other, and one end thereof is connected to an inverting terminal of the operational amplifier.

3. The device of claim 2, wherein the current detection circuit further comprises a first connecting resistance configured to connect one end of the shunt resistance to a non-inverting terminal of the operational amplifier, and a second connecting resistance configured to connect the other end of the shunt resistance to the inverting terminal of the operational amplifier.

4. The device of claim 2, wherein the control unit is configured to apply the first high voltage signal and the first low voltage signal to the shunt resistance at time intervals through the detection signal output terminal, in a state where a switch is controlled to an ON state, and to measure the first voltage change amount with respect to the output voltage of the operational amplifier through the ADC, when the first high voltage signal and the first low voltage signal are being applied to the shunt resistance.

5. The device of claim 4, wherein the control unit is configured to apply a third high voltage signal and a third low voltage signal to the shunt resistance at time intervals through the detection signal output terminal, in a state where the switch is controlled to an OFF state, to determine a second voltage change amount being a difference of voltages being applied to both terminals of the shunt resistance when the third high voltage signal and the third low voltage are being applied to the shunt resistance, to determine a third voltage change amount corresponding to a difference between the first voltage change amount and the second voltage change amount, and to determine the insulation resistance of the battery using the predefined insulation resistance formula that includes the third voltage change amount as a parameter.

6. The device according to claim 5, wherein the control unit is configured to selectively apply the second high voltage signal or the second low voltage signal to the first control resistance and the second control resistance through the first and second control signal output terminal until the output voltage of the operational amplifier being measured through the ADC belongs to a predetermined operating voltage range of the ADC, when the output voltage does not belong to the predetermined operational voltage range.

7. The device according to claim 5, wherein the predefined insulation resistance formula further comprises as a parameter a control voltage change amount being a difference of voltages being applied to an equivalent resistance of the first control resistance and the second control resistance according to a level of the voltage signal being output through the first and second control signal output terminal, when a high voltage signal and a low voltage signal are being applied to the shunt resistance through the detection signal output terminal.

8. The device according to claim 4, wherein the control unit is configured to selectively apply a second high voltage signal or a second low voltage signal to the first control resistance and the second control resistance through the first and second control signal output terminal until the output voltage of the operational amplifier being measured through the ADC belongs to a predetermined operating voltage range of the ADC, when the output voltage does not belong to the predetermined operational voltage range.

9. The device according to claim 4, wherein the predefined insulation resistance formula further comprises as a parameter a control voltage change amount being a difference of voltages being applied to an equivalent resistance of the first control resistance and the second control resistance according to a level of the voltage signal being output through the first and second control signal output terminal, when a high voltage signal and a low voltage signal are being applied to the shunt resistance through the detection signal output terminal.

10. The device of claim 2, wherein the control unit is configured to selectively apply the second high voltage signal or the second low voltage signal to the first control resistance and the second control resistance through the first and second control signal output terminal.

11. The device of claim 1, further comprising a memory unit configured to store a resistance value of the insulation resistance therein.

12. The device of claim 1, wherein the control unit is configured to output a resistance value of the insulation resistance to an external control device.

13. A method for measuring insulation resistance of a battery using a parameter resistance connected to a negative electrode terminal of the battery, a shunt resistance, a switch installed between the parameter resistance and the shunt resistance, an operational amplifier connected to both terminals of the shunt resistance and a control resistance coupled to at least one of input terminals of the operational amplifier so that an output voltage of the operational amplifier may be controlled, the method comprising:
(a) controlling the switch to an ON state;
(b) measuring the output voltage of the operational amplifier when a first high voltage signal and a first low voltage signal are applied to the shunt resistance at time intervals;
(c) applying a control voltage signal to one end of the control resistance to control the output voltage of the operational amplifier to be included within a predetermined range;
(d) determining a first voltage change amount with respect to the output voltage of the operational amplifier, the first voltage change amount being a difference of voltages being applied to both terminals of the shunt resistance when the first high voltage signal and the first low voltage signal are applied to the shunt resistance; and
(e) determining the insulation resistance of the battery using a predefined insulation resistance formula that includes the first voltage change amount as a parameter.

14. The method of claim 13, further comprising:
controlling the switch to an OFF state;
applying a third high voltage signal and a third low voltage signal to the shunt resistance at time intervals through a detection signal output terminal;
measuring the output voltage of the operational amplifier when the third high voltage signal and the third low voltage signal are applied;

applying the control voltage signal to one end of the control resistance to control the output voltage of the operational amplifier to be included within a predefined range;

determining a second voltage change amount with respect to the output voltage of the operational amplifier, the second voltage change amount being a difference of voltages being applied to both terminals of the shunt resistance when the third high voltage signal and the third low voltage are being applied to the shunt resistance;

determining a third voltage change amount corresponding to a difference between the first voltage change amount and the second voltage change amount; and determining the insulation resistance of the battery using the predefined insulation resistance formula that includes the third voltage change amount as a parameter.

15. The method of claim 14, wherein the control resistance includes at least two control resistances connected in parallel, one end of each control resistance is connected to an inverting terminal of the operational amplifier, and further including selectively applying a second high voltage signal or a second low voltage signal to each control resistance so that the output voltage of the operational amplifier is included within a predetermined range.

16. The method of claim 14, wherein the predefined insulation resistance formula further comprises as a parameter a control voltage change amount being a difference of voltages being applied to the control resistance with reference to when a high voltage signal is applied to the shunt resistance and when a low voltage signal is applied to the shunt resistance.

17. The method of claim 14, further comprising storing a resistance value of the insulation resistance in a memory unit, or outputting a resistance value of the insulation resistance to an external control device.

18. The method of claim 13, wherein the control resistance includes at least two control resistances connected in parallel, one end of each control resistance is connected to an inverting terminal of the operational amplifier, and further including selectively applying a second high voltage signal or a second low voltage signal to each control resistance so that the output voltage of the operational amplifier is included within a predetermined range.

19. The method of claim 13, wherein the predefined insulation resistance formula further comprises as a parameter a control voltage change amount being a difference of voltages being applied to the control resistance with reference to when a high voltage signal is applied to the shunt resistance and when a low voltage signal is applied to the shunt resistance.

20. The method of claim 13, further comprising storing a resistance value of the insulation resistance in a memory unit, or outputting a resistance value of the insulation resistance to an external control device.

* * * * *